United States Patent
Kasuga et al.

(10) Patent No.: US 8,473,674 B2
(45) Date of Patent: Jun. 25, 2013

(54) INFORMATION PROCESSING DEVICE INCLUDING A PLURALITY OF CELLS TO STORE DATA, STORAGE CONTROL DEVICE THAT CONTROLS A STORAGE SECTION INCLUDING A PLURALITY OF CELLS TO STORE DATA, AND STORAGE CONTROL METHOD OF CONTROLLING A REFRESH OPERATION OF A STORAGE SECTION INCLUDING A PLURALITY OF CELLS TO STORE DATA

(75) Inventors: Kazunori Kasuga, Kawasaki (JP); Osamu Ishibashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 368 days.

(21) Appl. No.: 12/731,400

(22) Filed: Mar. 25, 2010

(65) Prior Publication Data

US 2010/0180152 A1 Jul. 15, 2010

Related U.S. Application Data

(63) Continuation of application No. PCT/JP2007/069573, filed on Oct. 5, 2007.

(51) Int. Cl.
*G06F 12/00* (2006.01)
(52) U.S. Cl.
USPC .................................. 711/106; 711/E12.022
(58) Field of Classification Search
None
See application file for complete search history.

(56) References Cited

U.S. PATENT DOCUMENTS

| 5,623,451 | A | 4/1997 | Kawagoe | |
|---|---|---|---|---|
| 5,629,898 | A | 5/1997 | Idei et al. | |
| 5,784,548 | A * | 7/1998 | Liong et al. | 714/6.24 |
| 6,389,505 | B1 * | 5/2002 | Emma et al. | 711/106 |
| 6,483,764 | B2 | 11/2002 | Hsu et al. | |
| 6,914,841 | B1 * | 7/2005 | Thwaite | 365/222 |
| 7,035,155 | B2 * | 4/2006 | Stimak et al. | 365/222 |
| 7,345,941 | B2 | 3/2008 | Matsui | |
| 2003/0105933 | A1 * | 6/2003 | Keskar et al. | 711/167 |
| 2003/0217246 | A1 * | 11/2003 | Kubota et al. | 711/170 |
| 2005/0169084 | A1 | 8/2005 | Matsui | |
| 2007/0033339 | A1 * | 2/2007 | Best et al. | 711/106 |
| 2007/0106838 | A1 * | 5/2007 | Choi | 711/106 |

FOREIGN PATENT DOCUMENTS

JP 6-60647 3/1994

(Continued)

OTHER PUBLICATIONS

Taiwanese Office Action for corresponding Taiwanese Application 10120290430; dated Mar. 29, 2012.
Form PCT/ISA/237, mailed Mar. 25, 2008, in corresponding International Application No. PCT/JP2007/069573 (3 pp.).

(Continued)

*Primary Examiner* — Edward Dudek, Jr.
*Assistant Examiner* — Sean D Rossiter
(74) *Attorney, Agent, or Firm* — Staas & Halsey LLP

(57) ABSTRACT

An information processing device includes a first storage section 2 that includes a plurality of cells to store data; a second storage section 3 that holds refresh intervals and the states of implementation of refresh operations for each of a plurality of the cells; and a control section that controls the refresh operation of each of the cells on the basis of the refresh intervals and the states of implementation of refresh operations held by the second storage section 3. The information processing device controls the refresh operation of each of the cells at refresh intervals set for respective cells.

16 Claims, 10 Drawing Sheets

FOREIGN PATENT DOCUMENTS

| | | |
|---|---|---|
| JP | 7-169268 | 7/1995 |
| JP | 7-176185 | 7/1995 |
| JP | 07-176185 | 7/1995 |
| JP | 8-306184 | 11/1996 |
| JP | 9-102193 | 4/1997 |
| JP | 11-96760 | 4/1999 |
| JP | 2002-230970 | 8/2002 |
| JP | 2002-319282 | 10/2002 |
| JP | 2004-30738 | 1/2004 |
| JP | 2005-222593 | 8/2005 |

OTHER PUBLICATIONS

International Preliminary Report on Patentability, mailed May 4, 2010, in corresponding International Application No. PCT/JP/069573 (4 pp.).

Japanese Office Action issued Jul. 31, 2012 in corresponding Japanese Patent Application No. 2009-535938.

Chinese Office Action for corresponding Chinese Application 200780100886.5; issued Apr. 18, 2012.

* cited by examiner

FIG. 5
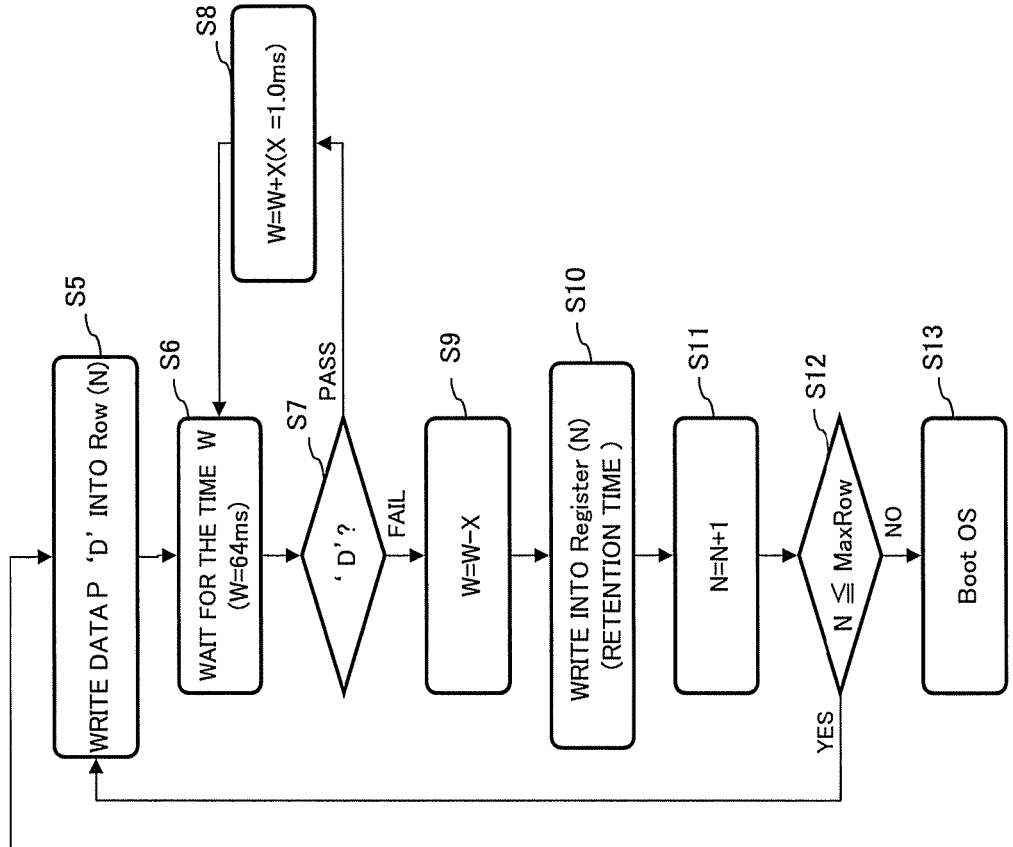
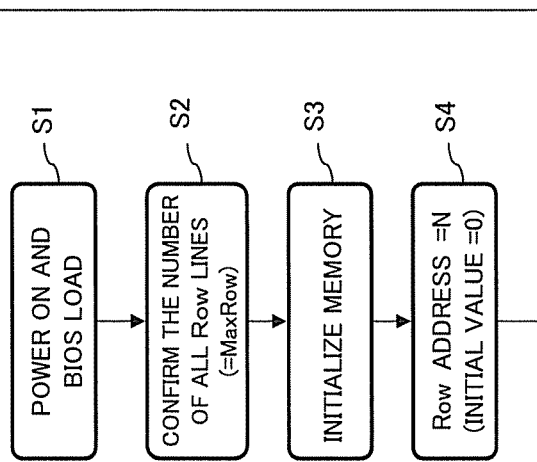

INFORMATION PROCESSING DEVICE INCLUDING A PLURALITY OF CELLS TO STORE DATA, STORAGE CONTROL DEVICE THAT CONTROLS A STORAGE SECTION INCLUDING A PLURALITY OF CELLS TO STORE DATA, AND STORAGE CONTROL METHOD OF CONTROLLING A REFRESH OPERATION OF A STORAGE SECTION INCLUDING A PLURALITY OF CELLS TO STORE DATA

CROSS-REFERENCE TO RELATED APPLICATIONS

This application is a continuation application, filed under 35 U.S.C. §111(a), of PCT Application No. PCT/JP2007/069573, filed Oct. 5, 2007, the disclosure of which is herein incorporated in its entirety by reference.

FIELD

The present invention relates to an information processing device, a storage control device, and a storage control method which control the refresh operation of a memory.

BACKGROUND

The narrow processing of memory is making progress as semiconductor manufacturing technology advances. As a result, the time during which a memory retains data is getting shorter, and power consumption is increasing due to frequent refresh operations. The decline in data-retaining time due to deterioration in memory's current-carrying performance is also one of the causes of malfunction.

On the other hand, demand for much lower power consumption is increasing as the use of portable information devices such as notebook computer has become more widespread.

A current typical refresh operation is to periodically refresh a memory. For example, it is usual for a 512-Mbit SDRAM to perform the refresh operation of 32,768 Row lines within 64 ms. One refresh command allows four Row addresses to be refreshed. Therefore, the refresh commands are transmitted at intervals of 7.8 μs (nearly equal to the result of the following calculation: 64 ms/(32768/4)).

Conventional techniques are disclosed in the following documents:
[Patent Document 1] Japanese Laid-open Patent Publication No. 2002-319282
[Patent Document 2] Japanese Laid-open Patent Publication No. 2002-230970
[Patent Document 3] Japanese Laid-open Patent Publication No. 7-176185

SUMMARY

An information processing device includes a first storage section that includes a plurality of cells to store data; a second storage section that holds refresh intervals and the states of implementation of refresh operations for each of a plurality of the cells; and a control section that controls the refresh operation of each of the cells on the basis of the refresh intervals and the states of implementation of refresh operations held by the second storage section.

Moreover, a storage control device that controls a storage section including a plurality of cells to store data controls a refresh operation of each of the cells on the basis of refresh intervals and the states of implementation of refresh operations for each of a plurality of the cells.

Furthermore, a storage control method of controlling a refresh operation of a storage section including a plurality of cells to store data includes a step that reads out refresh intervals and the states of implementation of refresh operations for each of a plurality of the cells; and a step that controls the refresh operation of each of the cells on the basis of the refresh intervals and the states of implementation of refresh operations.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 5 is a flowchart illustrating an example of the process of setting retention time in an information processing device according to the first embodiment of the present invention.

DESCRIPTION OF EMBODIMENTS

Embodiments of the present invention will be described with reference to the accompanying drawings.

When the refresh commands are used with the conventional technique, the Row address to be refreshed is determined by an internal counter of a memory. Therefore, the Row address to be refreshed may not be specified from the outside. Accordingly, data are not always written into all the Row addresses, meaning that the Row addresses into which data are not written may be refreshed unconditionally.

Moreover, the standard values of refreshing are set by a standardization organization and are not values representing real abilities of memories. In fact, each memory has a sufficient data-retaining capability and is excessively refreshed given the real ability of the memory.

Furthermore, there are differences in data-retaining capability between the Row addresses of the same memory, and some of the Row addresses are excessively refreshed. In general, since the refresh commands are mechanically transmitted at regular intervals such as 7.8 μs, data may not be retained and a system error may occur when the data-retaining time of the Row address becomes shorter than the refresh interval due to the deterioration of memory capability.

The embodiments of the present invention described below have been made to solve the above problems and aim to provide a technique capable of reducing power consumption and improving reliability by changing refresh intervals for each of the Row addresses.

First Embodiment

A first embodiment of the present invention will be described hereinafter with reference to the accompanying drawings. Incidentally, an information processing device of the first embodiment is to give data-writing flags to all Row addresses (cells) of a memory to refresh only the Row addresses into which data have already been written, thereby reducing power consumption. Furthermore, the information processing device of the first embodiment is to measure the data-retaining time of each Row address based on which the information processing device performs refreshing, thereby improving reliability.

Figure 1:
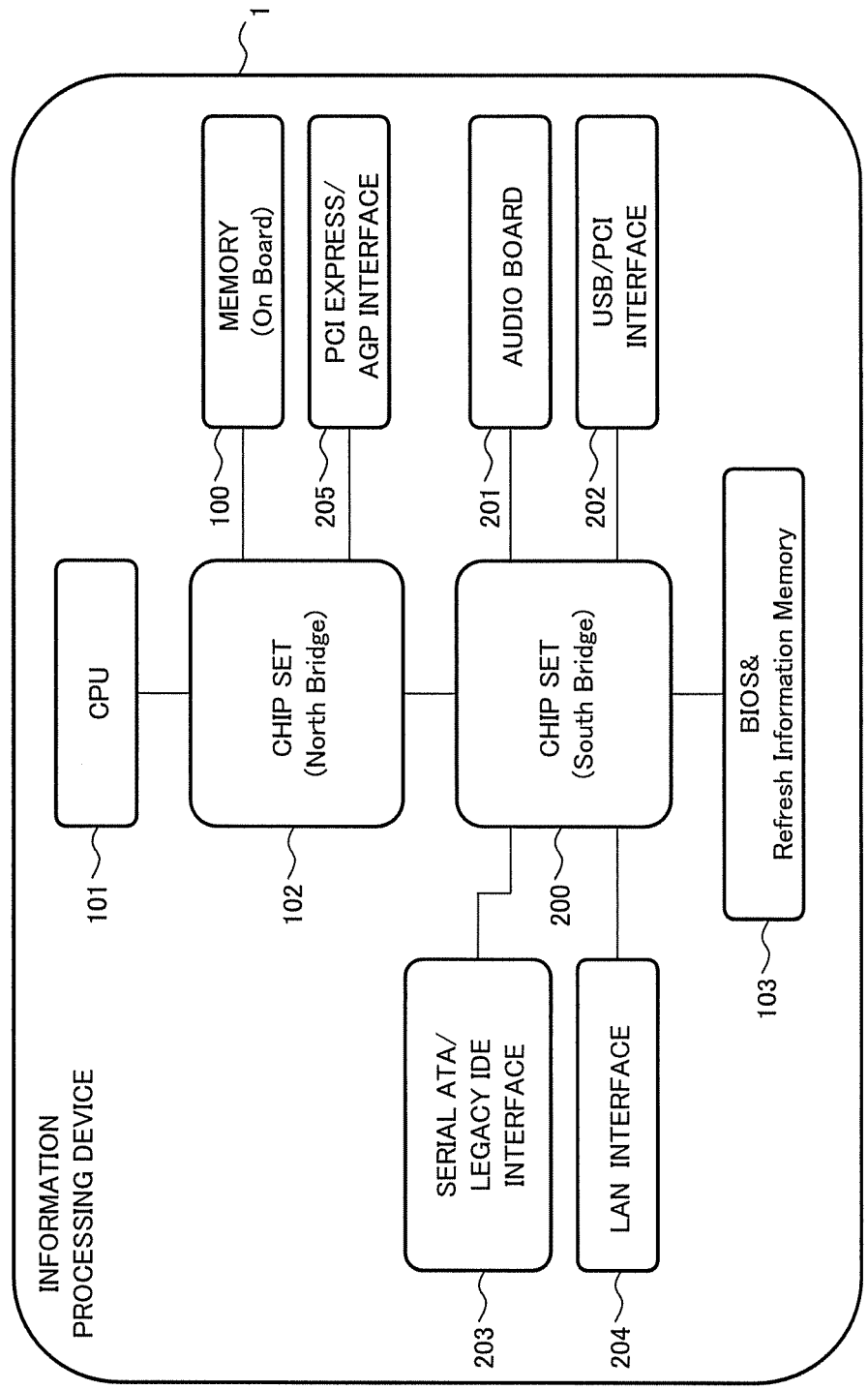
FIG. 1 is a view illustrating an example of the hardware configuration of an information processing device according to an embodiment of the present invention.

FIG. 1 illustrates the hardware configuration of the information processing device of the first embodiment. The information processing device 1 is equipped with a memory 100 that is a major storage device; and a CPU 101 that is a central processing unit. The information processing device 1 is also equipped with a chip set (North Bridge) 102 that carries out information communication and control at high speeds between the CPU 101, the memory 100 and the like; and BIOS 103 that stores a group of programs to control the lowest-level input and output of a peripheral device. The BIOS 103 is equipped with a nonvolatile memory (Refresh Information Memory).

Besides the above components, the information processing device 1 is equipped with a chip set (South Bridge) 200 that carries out information communication and control between peripheral devices at relatively lower speeds than the CPU 101 and the memory 100; an audio board 201 that controls output of a sound source; a USB/PCI interface 202 that connects to USB or PCI bus-compliant devices; a serial ATA/legacy IDE interface 203 that connects to hard disk drives and the like; and a LAN interface 204 that connects to a network board and enables communication with the outside.

Figure 2:
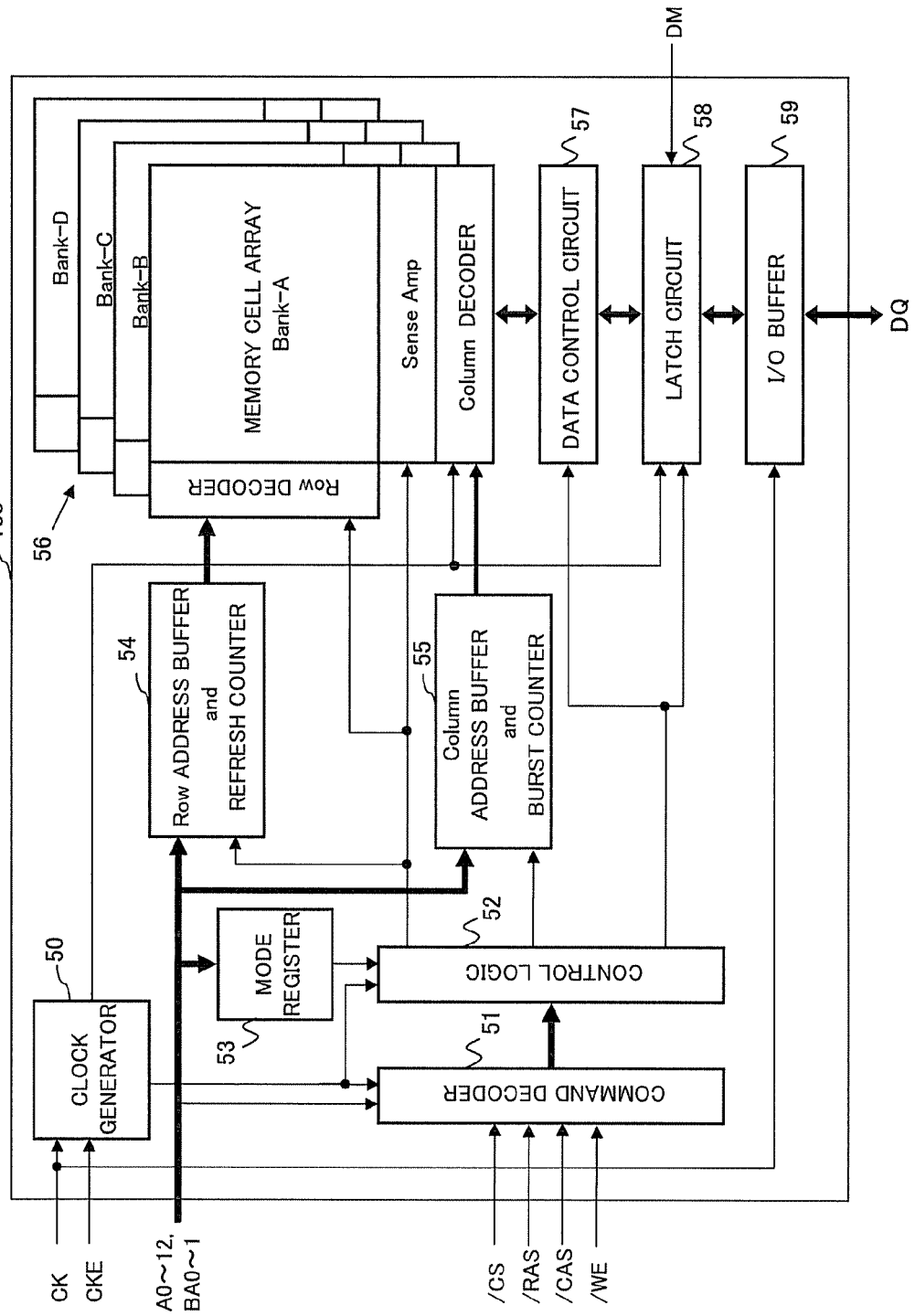
FIG. 2 is a view illustrating an example of the configuration of a memory according to an embodiment of the present invention.

FIG. 2 illustrates the internal configuration of the memory 100 of the first embodiment. Incidentally, bold arrows in FIG. 2 indicate the flow of data and thin arrows indicate the flow of control. The memory 100 is equipped with a clock generator 50 that generates internal clocks from clocks input from the outside; a command decoder 51 that determines the operation of reading, writing or the like from control signals input from the outside; a control logic circuit 52 that receives output from the command decoder 51 and controls internal circuits; and a mode register 53 in which an operational mode is stored at the time of initialization of the memory 100.

Moreover, the memory 100 is equipped with a Row address buffer that retains address signals input from the outside; and a refresh counter that automatically generates refresh addresses during refresh operation (a Row address buffer and refresh counter 54). The memory 100 is also equipped with a Column address buffer that retains address signals input from the outside; and a burst counter that automatically generates Column addresses during burst operation (a Column address buffer and burst counter 55). In addition, the memory 100 is equipped with a memory cell array section 56 that retains data; a data control circuit 57; a latch circuit 58; and an I/O buffer 59. Incidentally, a memory cell array section 56 is divided into a plurality of areas (from Bank-A to Bank-D), and each area is equipped with a Row decoder, Sense Amp, a Column decoder, and a memory cell array. A plurality of Row lines are provided in each of the memory cell arrays, from Bank-A to Bank-D.

Figure 3:
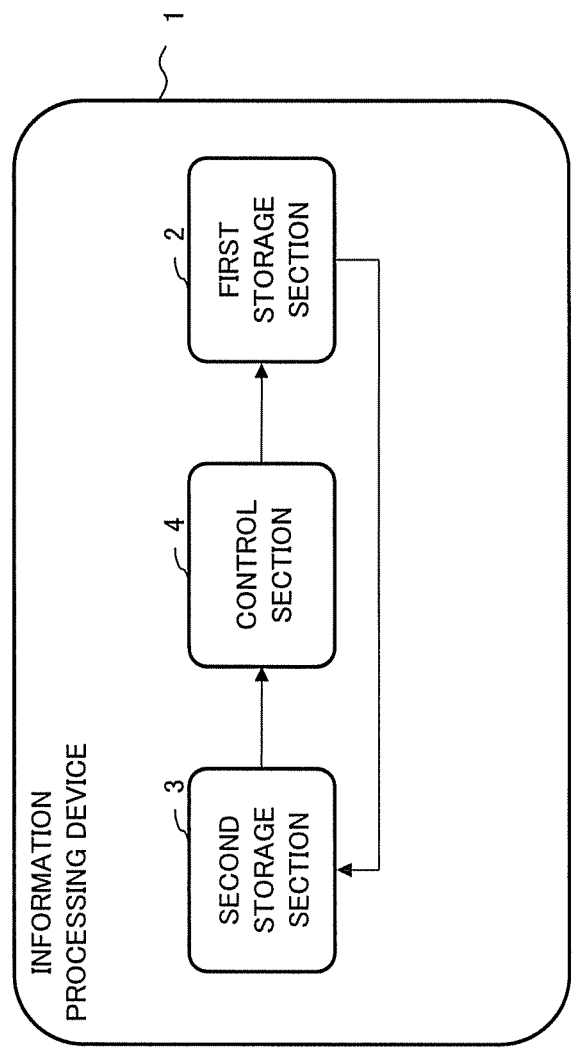
FIG. 3 is a view illustrating an example of the functional blocks of an information processing device according to an embodiment of the present invention.

FIG. 3 illustrates functional blocks of the information processing device 1. The information processing device 1 is equipped with a first storage section 2, a second storage section 3 and a control section 4. Each of the functional blocks can be realized with the use of the above hardware configuration.

The first storage section 2 corresponds to the above memory 100 and includes a plurality of Row addresses to store data. The second storage section 3 corresponds to the nonvolatile memory in the above BIOS 103 and retains the retention time (refresh interval) for each of a plurality of the Row addresses; the latest refresh time (the state of implementation of refresh operations); and data-writing flags indicating whether valid data have been written into each of a plurality of the Row addresses. Incidentally, the second storage section 3 is the nonvolatile memory of the BIOS 103 in the above case, but is not limited to the nonvolatile memory. For example, a storage area provided in the chip set (North Bridge) 102 or part of an area of the memory 100 may be used as the second storage section 3.

The control section 4 corresponds to the CPU 101, the BIOS 103 (portions except for the nonvolatile memory), the chip set (North Bridge) 102 and the chip set (South Bridge) 200. The control section 4 controls the refresh operation of Row addresses of the first storage section 2 on the basis of information retained by the second storage section 3.

Figure 4:
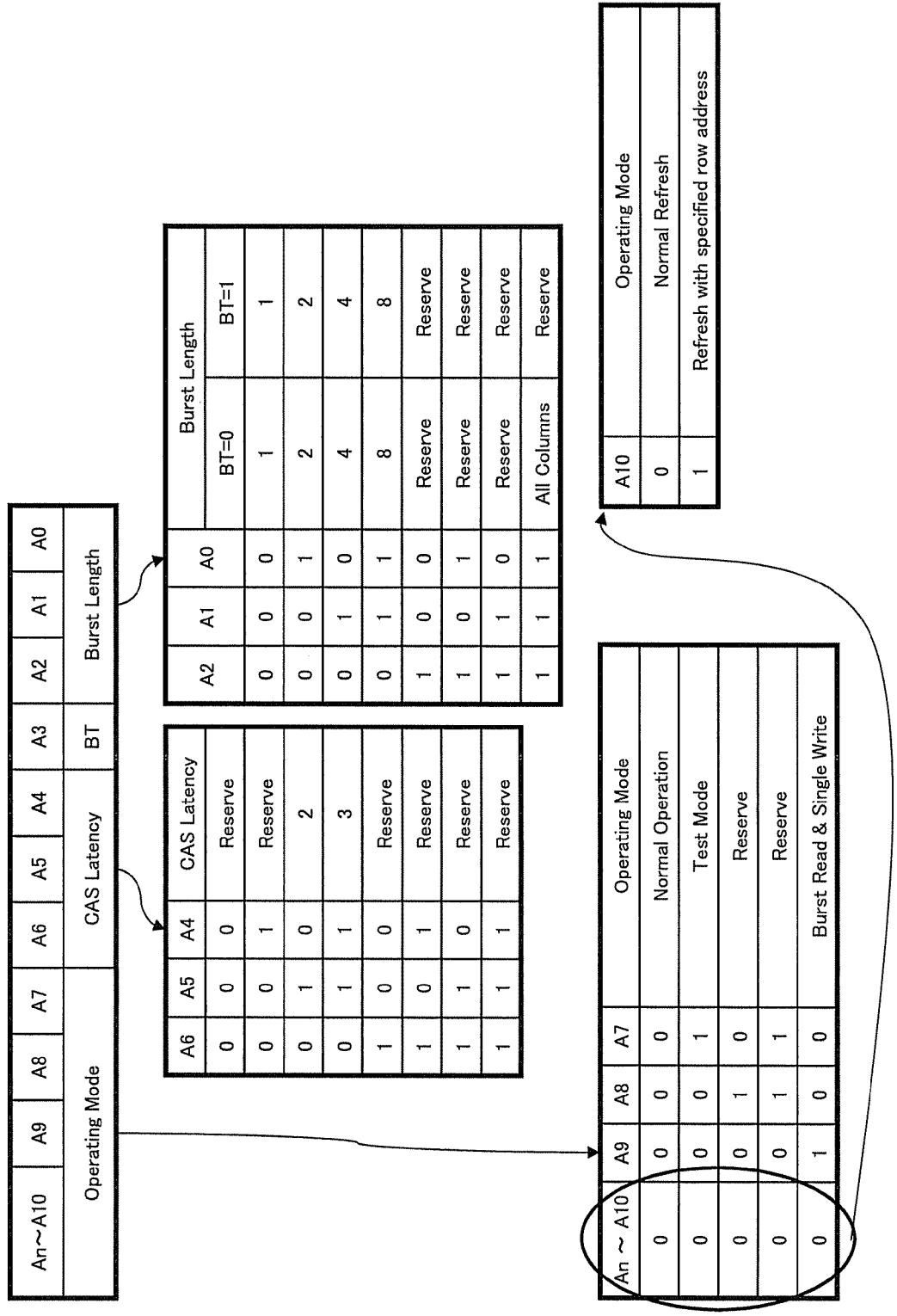
FIG. 4 is a view illustrating an example of data stored in a mode register according to a first embodiment of the present invention.

A group of registers to be stored in the mode register 53 of the first storage section 2 will be described below with reference to FIG. 4. Values stored from an address A0 to an address A2 define the number of Column addresses (Burst Length) that are read out (or written) with one read-out command (or one write command). A value stored in an address A3 defines type of burst. Values stored from an address A4 to an address A6 define the number of clocks (CAS Latency) that it takes for data to be output after the read-out command. An address A7 and subsequent addresses are registers that define operational modes and the like as options and are, for example, used to define a device mode (Test Mode) and the like that are unique to a memory manufacturer. The information processing device 1 of the first embodiment makes use of an address A10. When the register A10 is "0", the control section 4 carries out control in a normal refresh mode. When the register A10 is "1", the control section 4 carries out control in a mode of refreshing the specified Row address. Incidentally, any unused registers may be used instead of the address A10.

As described above, there are two modes, the normal refresh mode and the mode of refreshing the specified Row address. Accordingly, the control section 4 uses the modes appropriately to meet the demands for capability and for lower power consumption. For example, if the information processing device 1 is a notebook computer, the control section 4 uses either one of the above two modes appropriately depending on whether the notebook computer runs on power supplied from an external power source or from an internal battery.

The following describes a process of measuring the data-retaining time (retention time) of each Row address and of setting the measured retention time in the register corresponding to the Row address, with reference to a flowchart of FIG. 5. Hereinafter, the number of a Row address to be processed is represented as a variable N (or variable M), and the Row address to be processed is represented as Row (N) (or Row(M)). An area that stores a setting value corresponding to Row (N) is represented as Register (N). Incidentally, suppose that Register (N) is provided in the second storage section 3.

After the power is turned on, the control section 4 loads a group of programs of the BIOS 103 (step S1). The control section 4 then confirms the number of all Row lines (MaxRow) (step S2). Subsequently, the control section 4 initializes the first storage section 2 (memory) (step S3) and sets the variable N (the initial value of N is zero) to the Row address whose retention time is to be measured (step S4).

Subsequently, the control section 4 writes predetermined data (data "D," for example) into Row (N) of the first storage section 2 in which the retention time is to be set (step S5), waits until the time W (W is a variable; the initial value is, for example, 64 ms) has passed (step S6), and then makes a determination as to whether the data stored in the Row (N) remains the one written at step S5 (the data "D," for example) (step S7). When the data stored in the Row (N) is the one written at step S5 (the data "D," for example) (PASS at step S7), the control section 4 adds the time X (1.0 ms, for example) to the time W, substitutes the result for the variable W again (step S8), and then returns to step S6.

The control section 4 repeatedly performs the above processes of steps S6, S7 and S8 until the data written at step S5 (the data "D," for example) becomes abnormal. When the data stored in the Row (N) becomes abnormal (FAIL at step S7), the control section 4 subtracts X from the variable W and then substitutes the result for the variable W again (step S9). The control section 4 then writes the variable W into the Register (N) as retention time (step S10).

The control section 4 increases the variable N by one (step S11) and compares the variable N and MaxRow (step S12). When the variable N is less than or equal to MaxRow (YES at step S12), the control section 4 returns to step S5. Meanwhile, when the variable N is greater than MaxRow after the above retention time is set for all the Row addresses (NO at step S12), the control section 4 boots an operating system (OS) (step S13).

As described above, the control section 4 sets the retention time for all the Row addresses in the first storage section 2.

Incidentally, even after the operating system of the information processing device 1 is booted, it is possible for the control section 4 to set again the retention time of the Register corresponding to the Row address where an failure occurs after the failure of operation of the Row address is detected. That is, by performing the above processes of steps S9 (the variable W is acquired as the retention time already set to the Row address) and S10, the control section 4 sets the refresh time again.

As described above, the control section 4 sets the refresh time again. Therefore, data can be retained even if a predetermined Row line of the first storage section 2 deteriorates in current-carrying performance and the data-retaining time becomes shorter than the standard value, making it possible to reduce errors in the information processing device 1.

Figure 6:
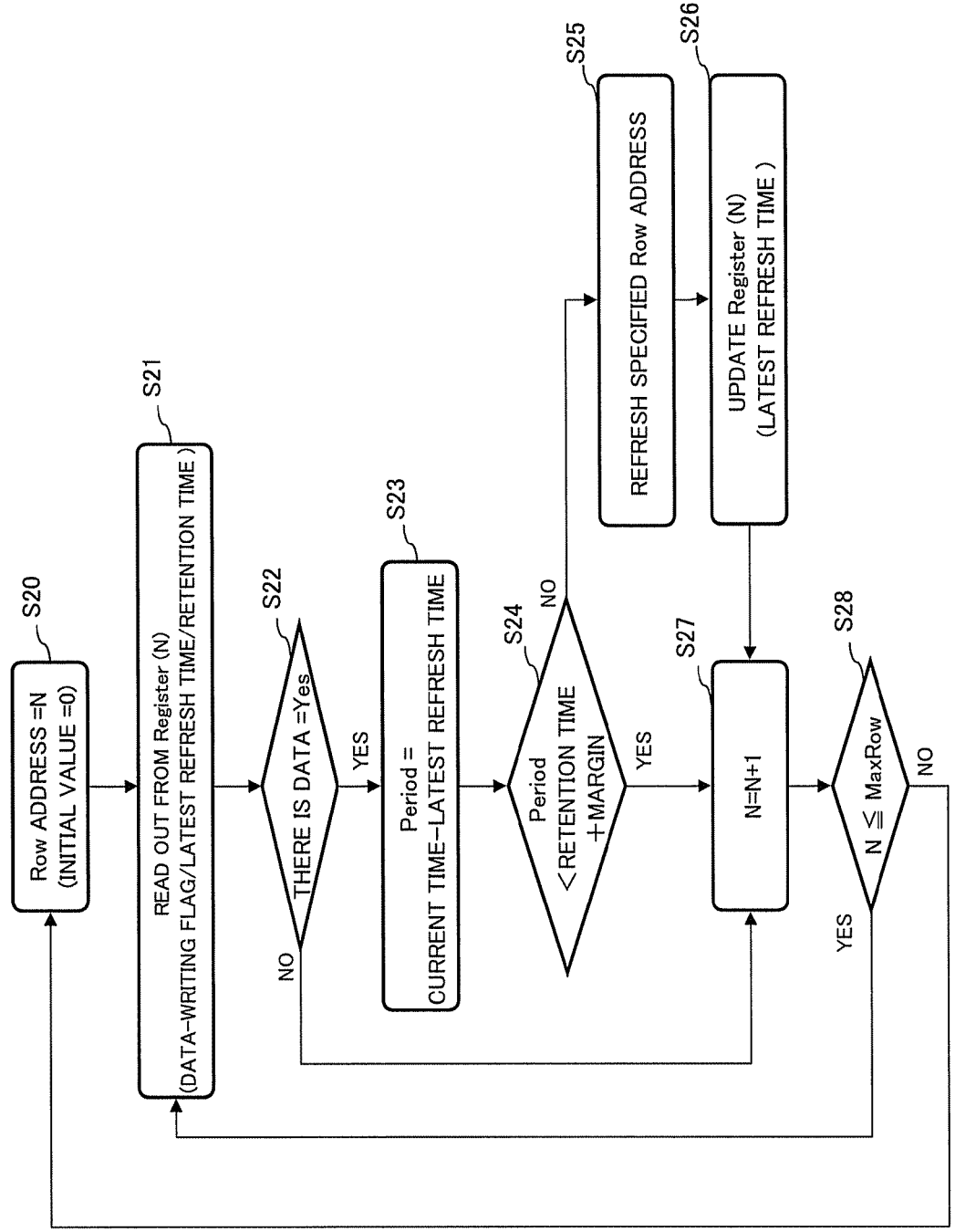
FIG. 6 is a flowchart illustrating an example of the process of controlling refresh operations in the information processing device according to the first embodiment of the present invention.

The following describes a refresh control process for Row addresses where the retention time has been set as described above, with reference to FIG. 6. Incidentally, suppose that the refresh control process described below is performed in a mode of refreshing the specified Row address (a mode in which "1" is set in the register A10 of the mode register 53 of the first storage section 2).

The control section 4 sets the Row (N) that is to be processed (the initial value is equal to zero) (step S20); and reads out from the Register (N) corresponding to the Row (N) a data-writing flag (a flag indicating whether or not data has been written into the Row (N)), the latest refresh time (the latest time at which the Row (N) is refreshed), and the retention time (step S21). The control section 4 confirms, on the basis of the data-writing flag, whether data is stored in the Row (N) (step S22). If data is stored (Yes at step S22), the control section 4 acquires Period (the elapsed time) from the latest refresh time by subtracting the latest refresh time from the current time (step S23). The control section 4 then adds a margin (the time for giving leeway to the elapsed time) to the retention time of the Row (N) and compares the result with Period (step S24). When Period is greater than or equal to the result of adding the retention time and the margin (NO at step S24), the control section 4 refreshes the specified Row address (Row (N)) of the first storage section 2 (step S25), and updates the latest refresh time of the Register (N) so that the latest refresh time is the current time (step S26). Incidentally, the control section 4 of the first embodiment compares Period with the retention time of the Row (N) to which the margin is added. However, Period may be compared with the retention time of the Row (N).

The control section 4 then increases the variable N by one (step S27) and compares the variable N with MaxRow (step S28). When the variable N is less than or equal to MaxRow (YES at step S28), the control section 4 returns to step S21. When the variable N is greater than MaxRow (NO at step S28), the control section 4 returns to the start (step S20) of the refresh process.

Incidentally, when it is determined that data is not stored (NO at step S22) or when Period is less than the retention time to which the margin is added (YES at step S24), the control section 4 proceeds to step S27.

In the above process of step S25, in the case of a normal refresh command, an arbitrary Row address is selected by the internal counter (the Row address buffer and refresh counter 54) of the first storage section 2. In order to handle the above case, the control section 4 uses an active command, a read command, a read command with auto-precharge, and a precharge command in combination to perform the refresh process for the first storage section 2.

Figure 7:
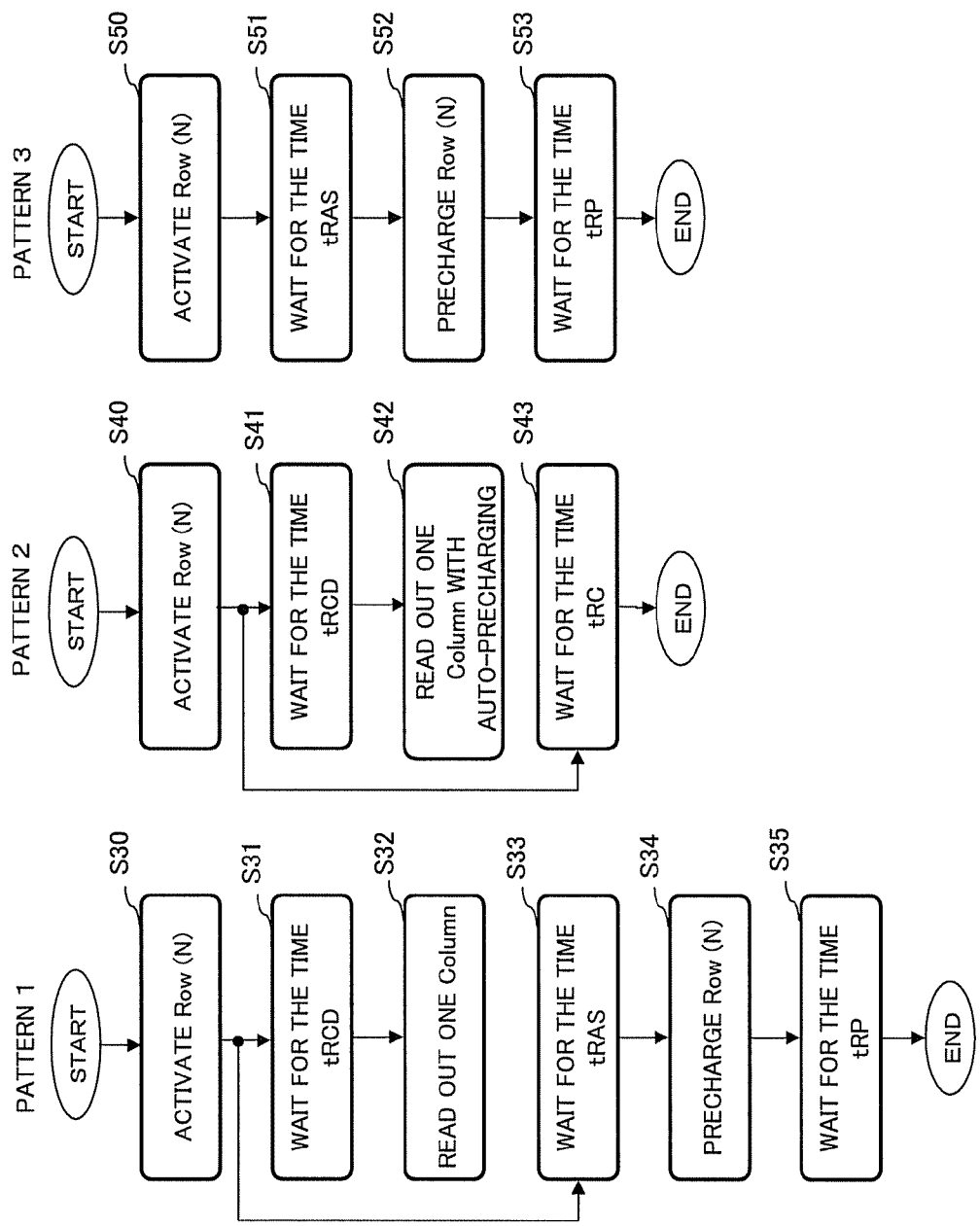
FIG. 7 is a flowchart illustrating an example of the process of refresh operations in the information processing device according to the first embodiment of the present invention.

The refresh process of step S25 will be further described with reference to flowcharts of FIG. 7. By receiving from the control section 4 combinations of the above commands, the first storage section 2 uses one of the following three patterns to perform the refresh process: a process of performing activating, reading and precharging (Pattern 1), a process of performing activating and reading with auto-precharge (Pattern 2), and a process of performing activating and precharging (Pattern 3).

Pattern 1 will be described. After receiving an active command, the first storage section 2 activates the Row (N) (step S30). After waiting until the time tRCD has passed (step S31), the first storage section 2 receives a read command and therefore reads out one Column (step S32).

In the process of Pattern 1, after activation (step S30), the first storage section 2 waits until the time tRAS has passed for receiving a precharge command (step S33), while performing the processes of steps S31 and S32. After receiving the precharge command, the first storage section 2 precharges the Row (N) (step S34). Moreover, the first storage section 2 waits until the time tRP has passed for receiving a next active command.

The following describes Pattern 2. After receiving the active command, the first storage section 2 activates the Row (N) (step S40). After waiting until the time tRCD has passed (step S41), the first storage section 2 receives a read command with auto-precharge. The first storage section 2 therefore reads out one Column and carries out precharging (step S42).

After activating the Row (N) (step S40), the first storage section 2 waits until the time tRC has passed for receiving a next active command (step S43), while performing the above processes of steps S41 and S42.

A process of Pattern 3 will be described. After receiving the active command, the first storage section 2 activates the Row (N) (step S50). After waiting until the time tRAS has passed (step S51), the first storage section 2 receives the precharge command and therefore precharges the Row (N) (step S52). The first storage section 2 then waits until the time tRP has passed for receiving a next active command (step S53).

The above refresh control process and refresh process allow the information processing device 1 to refresh all the Row addresses with the retention time suitable for each of the Row addresses.

Moreover, the time during which data can be retained is largely dependent on temperatures. It is desirable that before the retention time is measured, the operating rates of all devices inside the information processing device 1 be raised to increase the temperature of the first storage section 2, because increasing the temperature brings the situation closer to the real operational state of the information processing device 1.

If it is difficult to raise the operating rates of all the devices, a similar effect can be obtained by installing a heat generator and a temperature sensor near the first storage section 2. That is, when the retention time is set, the information processing device 1 causes the heat generator to generate heat to make sure that the temperature is at the same level as when the operating rates of all the above devices are raised. Therefore, the temperature of the first storage section 2 rises.

Second Embodiment

According to a second embodiment of the present invention, an information processing device finds, from the data-retaining time (retention time) of each Row address measured in the first embodiment, a Row address that can retain data for a long time and gives priority to the Row address into which data is therefore written earlier than the other Row addresses. Since the Row address that can retain data for a long time is given priority and data is therefore written into the Row address earlier than the other Row addresses as explained above, the information processing device can reduce the number of times that the refresh process is performed, making it possible to lower power consumption.

Moreover, the above-discussed technique has developed, and the information processing device periodically moves data stored in a Row address that can retain data only for a short time to a Row address that can hold data for a long time, making it possible to further lower power consumption. In the second embodiment, the above processes will be described.

In addition to the functions of the control section 4 of the first embodiment, the control section 4 of the second embodiment is equipped with a function to determine a Row address into which data is to be written on the basis of the retention time; and a function to move data stored in a predetermined Row address to a cell whose retention time is longer than the Row address. Incidentally, the functional blocks and hardware configuration of the second embodiment are the same as the first embodiment except for the control section 4 and thus will not be described here.

Figure 8:
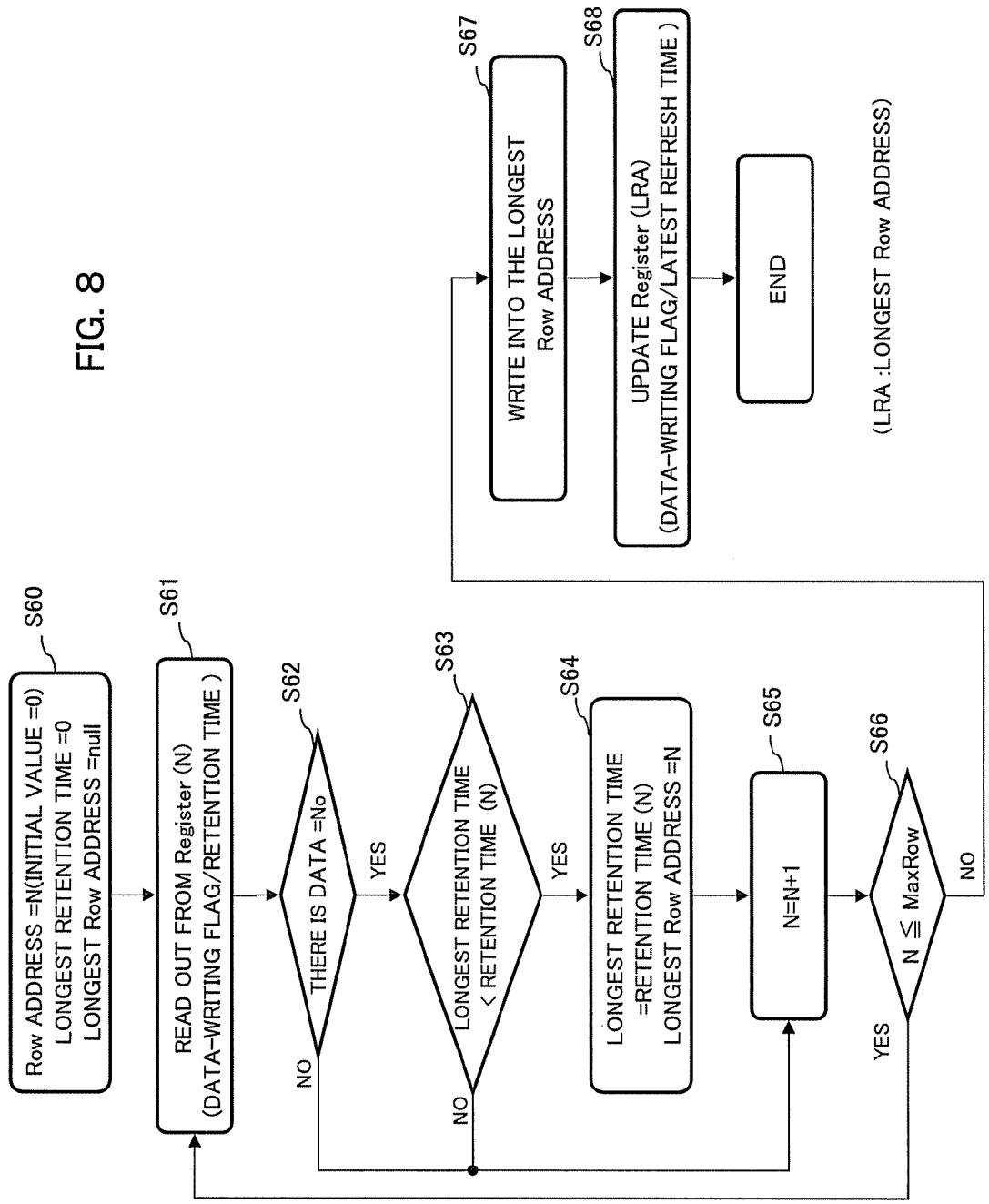
FIG. 8 is a flowchart illustrating an example of the process of storing data into a Row address having a long retention time earlier than into the other Row addresses in an information processing device according to a second embodiment of the present invention.

A process of writing data into the Row address whose retention time is long earlier than the other Row addresses will be described with reference to FIG. 8.

The control section 4 sets the following variables at initial values (step S60): Row (N) (the initial value of N is zero), the longest retention time (the initial value is equal to zero) for which the longest retention time is substituted out of those of the Row addresses, and the longest Row address (the initial value is equal to null) that is the Row address having the longest retention time. The control section 4 then reads out the data-writing flag of the Row (N) and the retention time from Register (N) (step S61).

The control section 4 makes a determination as to whether data is stored in the Row (N) on the basis of the data-writing flag (step S62). If data is not stored in the Row (N) (YES at step S62), the control section 4 compares the longest retention time and the retention time of the Row (N) (step S63). When the longest retention time is smaller than the retention time of the Row (N) (YES at step S63), the control section 4 substitutes the retention time of the Row (N) for the longest retention time and sets N to the longest Row address (step S64). Subsequently, the control section 4 increases the variable N by one (step S65) and compares the variable N with MaxRow (step S66).

When the variable N is larger than MaxRow (i.e. the above process has been done on all the Row addresses and the longest Row address having the longest retention time is found) (No at step S66), the control section 4 writes data into the longest Row address (step S67) and updates the data-writing flag and the latest refresh time held by Register (Register(LRA)) corresponding to the longest Row address (step S68).

Incidentally, when data is stored in the Row (N) at step S62 (NO at step S62) and when the longest retention time is greater than or equal to the retention time at step S63 (NO at step S63), the control section 4 proceeds to step S65. When the variable N is less than or equal to MaxRow at step S66 (YES at step S66), the control section 4 returns to step S61.

Figure 9:
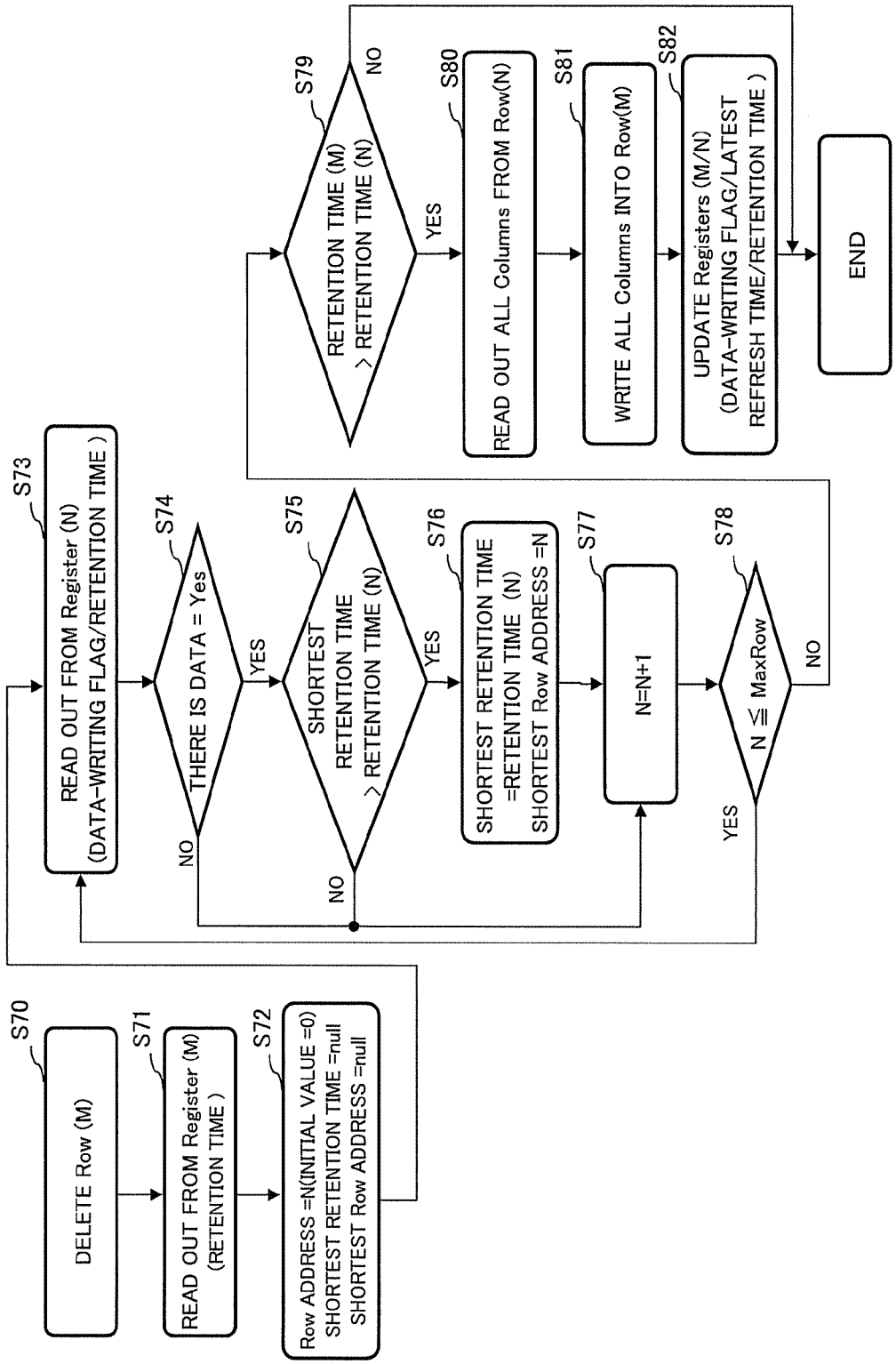
FIG. 9 is a flowchart illustrating an example of the process of moving data stored in a Row address having a short retention time to a Row address having a long retention time in an information processing device according to the second embodiment of the present invention.

The following describes a process of moving data stored in a Row address whose retention time is short to a Row address whose retention time is long, with reference to a flowchart of FIG. 9.

The control section 4 deletes data in Row (M), an area inside the first storage section 2 to which the above data is to be moved (step S70). Incidentally, suppose that the data stored in the Row (M) is invalid (It is possible to confirm whether there is data on the basis of the data-writing flag of the Row (M)). The control section 4 then reads out the retention time from Register (M) corresponding to the Row (M) (step S71).

The control section 4 then sets the following variables at initial values (step S72): Row (N) that is to be processed (the initial value is equal to zero), the shortest retention time for which the shortest retention time is substituted out of those of all Row addresses (the initial value is equal to null), and the shortest Row address that is a Row address having the shortest retention time (the initial value is equal to null).

The control section 4 reads out from Register (N) the data-writing flag and the retention time of the Row (N) (step S73) and makes a determination as to whether data is stored in the Row address (N) on the basis of the data-writing flag (step S74). When data is stored (Yes at step S74), the control section 4 compares the shortest retention time with the retention time of the Row (N) (step S75).

When the retention time of the Row (N) is smaller than the shortest retention time (YES at step S75), the control section 4 substitutes the retention time of the Row (N) for the shortest retention time so that the shortest Row address is the Row address (the variable N) that is currently processed (step S76). Subsequently, the control section 4 increases the variable N by one (step S77) and compares the variable N with MaxRow (step S78). When the variable N is less than or equal to MaxRow (YES at step S78), the control section 4 returns to step S73 and repeats the processes of steps S73 to S77.

When the variable N is larger than MaxRow after the above processes are repeated (i.e. the above processes have been done on all the Row addresses and the shortest Row address having the shortest retention time is found) (NO at step S78), the control section 4 compares the retention time of the Row (N) with the retention time of the Row (M) (step S79). When the retention time of the Row (M) is larger than the retention time of the Row (N) (YES at step S79), the control section 4 reads out all Columns from the Row (N) (step S80) and writes all the Columns that the control section 4 read out into the Row (M) (step S81). The control section 4 then updates the data-writing flags, the retention time and the latest retention time of Registers (M) and (N) (step S82).

Incidentally, when the determination of step S74 is NO and when the determination of step S75 is NO, the control section 4 proceeds to step S77. When the determination of step S78 is YES, the control section 4 returns to step S73. When the determination of step S79 is NO, the control section 4 ends the process.

Third Embodiment

When Row addresses have been grouped into a plurality of memory areas (groups) (for example, from Bank-A to Bank-D of the memory cell array section 56 as illustrated in FIG. 2), an information processing device periodically moves data of Row address stored in a predetermined memory area to another memory area (for example, moving data stored in Bank-A to Bank-B helps to put together data in Bank-B), thereby eliminating the need for refreshing the memory area from which data is moved and lowering power consumption further.

In addition to the functions of the control section 4 of the first embodiment, the control section 4 of a third embodiment of the present invention is equipped with a function to move data when data is stored across a plurality of memory areas so that the data is stored in a predetermined memory area. Incidentally, the functional blocks and hardware configuration of the third embodiment are the same as the first embodiment except for the control section 4 and thus will not be described here.

Figure 10:
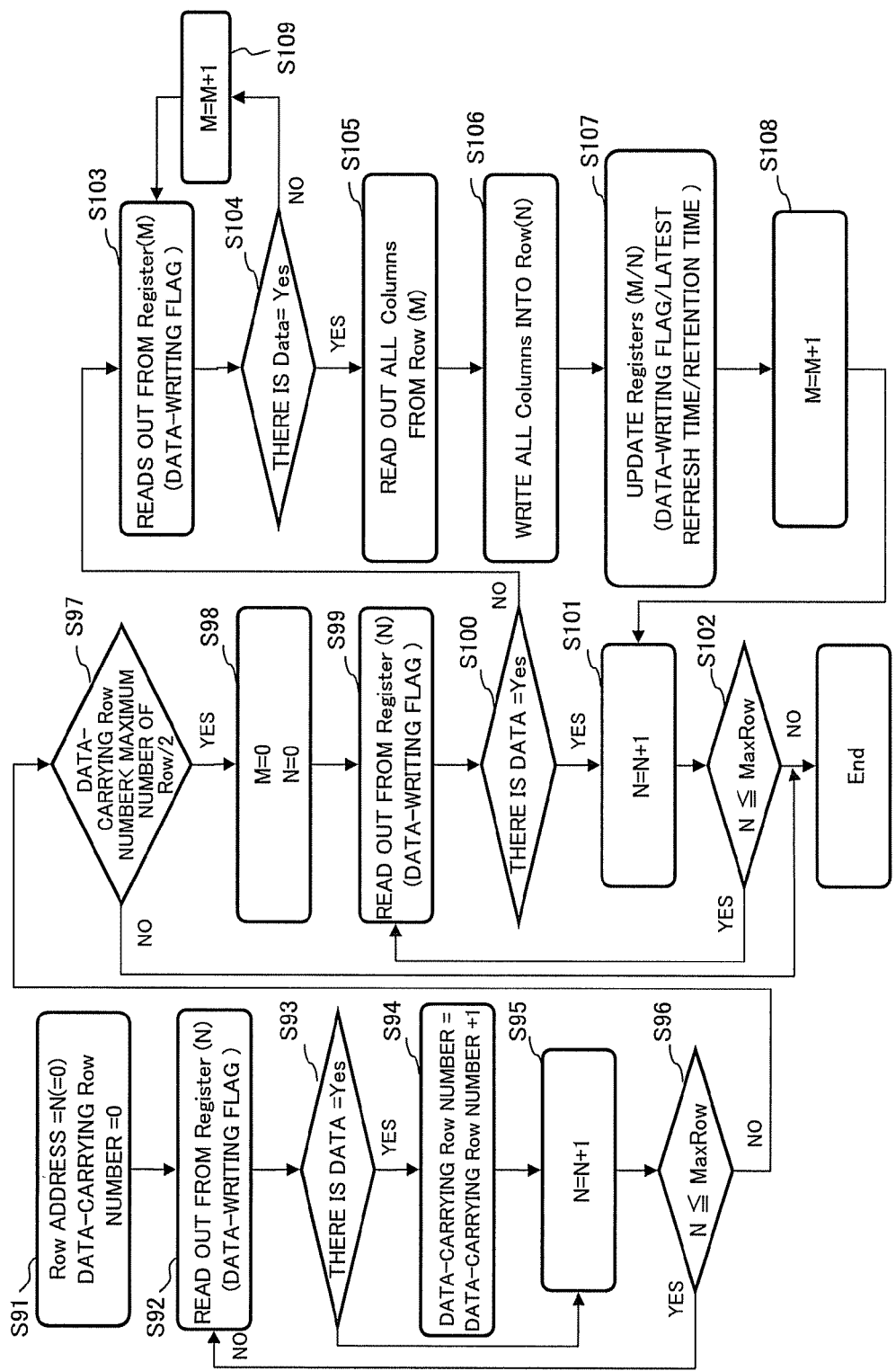
FIG. 10 is a flowchart illustrating an example of the process of moving data stored in a predetermined memory area, out of a plurality of memory areas, to another memory area in an information processing device according to a third embodiment of the present invention.

The above process of moving data to another memory area will be described with reference to a flowchart of FIG. 10. For ease of explanation, the focus is put on two memories (for example, Bank-A and Bank-B) in the description below. However, the information processing device 1 can deal with an increase in the number of Banks by performing the present process with sets of Banks, such as a set of Bank-C and Bank-D and a set of Bank-E and Bank-F (when additional memories are installed in the information processing device 1). Moreover, the information processing device 1 may perform the present process for each unit of memory board.

The control section 4 sets Row (N) (the initial value of N is equal to zero); the control section 4 also sets a data-carrying Row number, a variable representing the number of Row addresses in which there are valid data, at an initial value of zero (step S91). Subsequently, the control section 4 reads out the data-writing flag of the Row (N) from Register (N) (step S92) and makes a determination as to whether data is stored in the Row (N) (step S93).

When data is stored in the Row (N) (YES at step S93), the control section 4 increases the data-carrying Row number by one (step S94) and also increases the variable N (step S95). Incidentally, when data is not stored in the Row (N) (NO at step S93), the control section 4 increases only the variable N (step S95).

The control section 4 repeats the above process until the variable N exceeds MaxRow (a loop extending from YES of step S96 to step S92).

When the variable N is lager than MaxRow (NO at step S96), the control section 4 compares the data-carrying Row number with one-half of the maximum number of Rows (the maximum number of Rows/2) (step S97). When the data-carrying Row number is smaller than one-half of the maximum number of Rows (YES at step S97), the control section 4 substitutes zero for the variables M and N (step S98).

The control section 4 then reads out the data-writing flag of Register (N) (step S99) and makes a determination as to whether data is stored in the Row (N) (step S100). When no data is stored in the Row (N) (NO at step S100), the control section 4 reads out the data-writing flag of Register (M) (step S103) and makes a determination as to whether data is stored in the Row (M) (step S104). When data is stored in the Row (M) (YES at step S104), the control section 4 reads out all Columns from the Row (M) (step S105) and writes all the Columns that the control section 4 read out into the Row (N) (step S106).

Subsequently, the control section 4 updates the data-writing flags, the retention time and the latest refresh time of the Registers (M) and (N) (step S107), increases the variable M by one (step S108), and increases the variable N by one (step S101). The control section 4 then compares the variable N with MaxRow (step S102). When the variable N is less than or equal to MaxRow (YES at step S102), the control section 4 returns to step S99 and performs a series of processes from the above step S99 to step S101 (The processes of steps S103 to S108 may be included when needed).

When the variable N is greater than MaxRow (NO at step S102), the control section 4 ends the process.

Incidentally, when the determination of step S97 is NO, the control section 4 ends the process. When the determination of step S100 is YES, the control section 4 proceeds to step S101. When the determination of step S104 is NO, the control section 4 increases the variable M by one (step S109) and returns to step S103.

According to the third embodiment, it is possible to refresh only the memory areas where data have been written and to reduce power consumption.

In the embodiments, the information processing device 1 is described as having the first storage section 2, the second storage section 3 and the control section 4. However, the control section 4 may serve as a storage control device that controls storage sections.

As described above, it is possible to control the refresh operation of each cell on the basis of refresh intervals set for respective cells.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. An information processing device comprising:
a first storage section that includes a plurality of cells to store data;
a second storage section that holds refresh intervals and states of implementation of refresh operations for each of the plurality of the cells; and
a control section that controls the refresh operation of each of the plurality of cells based on the refresh intervals and the states of implementation of refresh operations held by the second storage section, wherein
the second storage section holds, as the state of implementation of refresh operations, a latest refresh time at which a latest refreshing of each of the plurality of cells is performed,
the second storage section holds flags indicating whether data is stored for each of the plurality of cells of the first storage section,
the control section determines, based on the flags, a cell to which the refresh operation is applied and controls the refresh operation of the determined cell, and
the control section makes a determination as to whether data is stored in each of the plurality of cells based on the flags, determines a cell whose calculation result of subtracting the latest refresh time from current time reaches the refresh interval out of the cells that the control section determines store data, and controls so as to carry out the refresh operation of the cell.

2. The information processing device according to claim 1, wherein
the control section determines a cell into which the data is written based on the refresh intervals.

3. The information processing device according to claim 2, wherein:
the control section determines that a cell having a longest refresh interval out of the cells that the control section determines do not store data is a cell into which the data is written.

4. The information processing device according to claim 1, wherein
the control section sets again the refresh intervals held by the second storage section when a failure is detected in the operation of the cell.

5. The information processing device according to claim 1, wherein
the control section selects one mode from among a plurality of modes by which refresh operations are defined, and controls the refresh operation of the cell based on the selected mode.

6. The information processing device according to claim 1, wherein
the control section moves data stored in a predetermined cell to a cell having a longer refresh interval than the predetermined cell.

7. The information processing device according to claim 6, wherein
the control section determines that a cell having a shortest refresh interval out of the cells that the control section determines store data is the predetermined cell.

8. The information processing device according to claim 1, wherein
the plurality of the cells in the first storage section are grouped into at least two groups; and
when data is stored across the groups, the control section moves the data so that the data is put together in a predetermined group.

9. A storage control device that controls a storage section including a plurality of cells to store data, the storage control device comprising:
a controller to control a refresh operation of each of the plurality of cells based on refresh intervals and states of implementation of refresh operations for each of the plurality of the cells, wherein
the state of implementation of refresh operations for each of the plurality of cells is a latest refresh time at which a latest refreshing of each of the plurality of cells is performed,
the controller determines, based on flags indicating whether data is stored for each of the plurality of cells of the storage section, a cell to which the refresh operation is applied, and controls the refresh operation of the determined cell, and
the controller makes a determination as to whether data is stored in each of the plurality of cells based on the flags, determines a cell whose calculation result of subtracting the latest refresh time from current time reaches the refresh interval out of the cells that the controller determines store data, and controls so as to carry out the refresh operation of the cell.

10. The storage control device according to claim 9, wherein
the controller determines a cell into which the data is written based on the refresh intervals.

11. The storage control device according to claim 9, wherein
the controller sets the refresh intervals again when a failure is detected in the operation of the cell.

12. The storage control device according to claim 9, wherein
the controller selects one mode from among a plurality of modes by which refresh operations are defined, and controls the refresh operation of the cell based on the selected mode.

13. A storage control method of controlling a refresh operation of a storage section including a plurality of cells to store data, the method comprising:
reading out refresh intervals and states of implementation of refresh operations for each of the plurality of the cells; and
controlling the refresh operation of each of the plurality of cells based on the refresh intervals and the states of implementation of refresh operations, wherein
the state of implementation of refresh operations for each of the plurality of cells is a latest refresh time at which a latest refreshing of each of the plurality of cells is performed,
the reading out of the refresh intervals and the states of implementation of refresh operations further determines, based on flags indicating whether data is stored for each of the plurality of cells, a cell to which the refresh operation is applied, and controls the refresh operation of the determined cell, and
the controlling makes a determination as to whether data is stored in each of the plurality of cells based on the flags, determines a cell whose calculation result of subtracting the latest refresh time from current time reaches the refresh interval out of the cells that store data, and controls so as to carry out the refresh operation of the cell.

14. The storage control method according to claim 13, wherein
the reading out of the refresh intervals and the states of implementation of refresh operations further determines a cell into which data is written based on the refresh intervals.

15. The storage control method according to claim 13, wherein
the reading out of the refresh intervals and the states of implementation of refresh operations further sets the refresh intervals again when a failure is detected in the operation of the cell.

16. The storage control method according to claim 13, wherein
the reading out of the refresh intervals and the states of implementation of refresh operations further selects one mode from among a plurality of modes by which refresh operations are defined, and performs the refresh operation of the cell based on the selected mode.

* * * * *